United States Patent
David et al.

[11] Patent Number: 6,015,505
[45] Date of Patent: *Jan. 18, 2000

[54] PROCESS IMPROVEMENTS FOR TITANIUM-TUNGSTEN ETCHING IN THE PRESENCE OF ELECTROPLATED C4'S

[75] Inventors: Lawrence D. David, Enfield, N.H.; Lisa A. Fanti, Hopewell Junction, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/960,839

[22] Filed: Oct. 30, 1997

[51] Int. Cl.[7] ................................................ H01L 21/00
[52] U.S. Cl. ..................... 252/79.2; 438/614; 438/654; 438/695; 438/756; 216/13; 216/72; 216/108
[58] Field of Search ................. 252/79.2, 79.4; 438/614, 654, 695, 754; 216/13, 72, 108

[56] References Cited

U.S. PATENT DOCUMENTS

| | | | |
|---|---|---|---|
| 5,462,638 | 10/1995 | Datta et al. | 252/79.2 |
| 5,486,282 | 1/1996 | Datta et al. | 205/123 |
| 5,503,286 | 4/1996 | Nye, III et al. | 216/13 |
| 5,543,032 | 8/1996 | Datta et al. | 205/670 |
| 5,629,564 | 5/1997 | Nye, III et al. | 257/762 |
| 5,800,726 | 9/1998 | Cotte et al. | 252/79.1 |

*Primary Examiner*—Robert Kunemund
*Assistant Examiner*—Duy-Vu Deo
*Attorney, Agent, or Firm*—Ratner & Prestia; Ira D. Blecker

[57] ABSTRACT

A process and etchant solution for chemical wet etching of thin film metals in the presence of a protected metal. The etching solution has a pH range of about 2.7 to 4.0. The etching solution may include hydrogen peroxide, potassium sulfate, and potassium EDTA, and it reduces or eliminates the incidence of etch-resistant metal without damaging the protected metal.

6 Claims, 3 Drawing Sheets

PROCESS IMPROVEMENTS FOR TITANIUM-TUNGSTEN ETCHING IN THE PRESENCE OF ELECTROPLATED C4'S

FIELD OF THE INVENTION

The present invention relates to the chemical wet etching of metal films in semiconductor applications, often in the presence of protruding features. In particular, the present invention describes a pH range for an etching solution which provides uniform etching of metal films in the presence of electroplated C4 solder bumps on semiconductor substrates or wafers. The metal films may be made of Titanium-Tungsten (TiW).

BACKGROUND OF THE INVENTION

Controlled Collapse Chip Connection (C4) is an advanced microelectronic chip packaging and connection technology. C4 is also known as "solder bump" and "flip chip." The basic idea of C4 is to connect chips, chip packages, or such other units by means of solder balls placed between two surfaces of the units. These tiny balls of electrically conductive solder bridge the gaps between respective pairs of metal pads on the units being connected. Each pad has a corresponding pad on the surface of the other unit so that the pad arrangements are mirror images. As the units are aligned and exposed to temperatures above the melting point of the solder, the solder balls on the pads of the first unit become molten and join to corresponding conductive pads (having no balls) on the second unit, making permanent connections between respective pads.

In C4, the solder balls typically are formed directly on the metal pads of the one surface. The bumps are electrically isolated from each other by the insulating material that surrounds each ball. The substrate might be undoped silicon (Si) or some other material. The bottom of the ball is electrically connected to the chip circuit. When the balls are aligned to metal pads on a second surface and reflowed, the liquid solder bumps wet the receiving pads. Upon cooling, relatively low-stress solder joints are formed. This process allows all of the connections to be made in one step, even with slight variations in the surfaces.

A major application of C4 is in joining semiconductor microchips (integrated circuits) to chip packages. Chips may be made in rectangular arrays on a monocrystalline slab of silicon, called a "wafer," which is a thin disc typically several inches across. Many chips may be formed on each wafer, then the wafer is diced into individual chips and the chips are "packaged" in units large enough to be handled. The C4 balls are placed on the chips while they are still in wafer form.

The wafers may be made as large as possible so as to reduce the number of wafers that must be processed to make a certain number of chips. For the same reason (among others), the chips may be made as small as possible. Thus, the best C4 fabrication system is one that can make thousands of very small, closely spaced solder balls each precisely placed over a large area.

C4 allows a very high density of electrical interconnections. Unlike earlier techniques which made connections around the perimeter of a chip or a chip package, C4 allows one or more surfaces of a chip or package to be packed with pads. The number of possible connections with C4 is roughly the square of the number that is possible with perimeter connection. Because the C4 balls can be made quite small, less than a hundredth of an inch in diameter, the surface density of C4 connections can be on the order of thousands per square inch.

Electrical engineers are constantly placing more and more circuits onto each chip, to improve performance and reduce cost. As the number of circuits on a chip grows, so does the number of connections needed. C4, which allows more connections in a small space than any other technique, is commercially important.

In addition to making area connection possible, C4 can also be used with perimeter connection techniques such as tape-automated bonding (TAB). In TAB, solder balls on a chip are pressed against a pattern of metal foil adhered on a plastic substrate of the chip package. These applications, too, are commercially important.

C4 solder bumps must be mechanically well-fastened to their substrates, or they may fail during the thermal stressing that is characteristic of routine device operation. A complex device such as a computer may have dozens of chips and hundreds or thousands of C4 solder ball connections. The entire device may be rendered useless if only one of the balls fails. Thus, the attachment of the C4 balls requires careful design. For this reason various carefully chosen layers may be placed between the solder bumps and substrate or wafer upon which they are built. The composition and characteristics of these interfacial layers, commonly referred to as the Ball Limiting Metallurgy or BLM, play an integral role in ensuring acceptable mechanical adhesion of the solder bump to the chip. In addition, these layers often act as a diffusion barrier between the solder and the chip metallurgy which may be composed of aluminum and/or copper. Without an adequate diffusion barrier, the solder will attack the chip wiring and destroy functionality.

There are several methods of forming solder bumps and BLM metal, one of which uses vacuum deposition. In this method, solder and BLM metal are evaporated in a vacuum chamber. The metal vapor coats everything in the chamber with a thin film of the evaporated metal. To form both metal pads and solder bumps on the wafer or substrate, the vapor is allowed to pass through holes in a metal mask held over the substrate. The vapor passing through the holes condenses onto the cool surface, forming discrete solder bumps. This method requires a high vacuum chamber to hold the substrate, mask, and flash evaporator.

In this approach, the mask is made specially with high-precision holes, or "vias," for locating the solder bumps. The mask will be heated as hot metal vapor released into the vacuum chamber condenses on it. To avoid misalignment of the vias due to thermal expansion, the masks may be made of special metals, and are geometrically compensated to optimize alignment. Even with this methodology, vacuum processing has limitations. After solder deposition, the metal mask cools and undergoes thermal contraction, and must be carefully removed without damaging the solder pads. Thus, this method cannot be used for extremely large wafers containing many chips.

An alternative technique for making solder bumps is electrodeposition, also known as electrochemical plating or electroplating. This method also uses a mask and forms solder bumps only at the selected sites, but this technique differs from the evaporation method in that the mask is created using photoprocessing. In addition, it requires a first preliminary step to create a continuous "seed layer" of conductive metal adhered onto the insulating substrate. The seed layer is needed to conduct the electricity which deposits solder. The seed layer is typically composed of several metal layers, which serve the additional purpose of forming the BLM metallurgy.

Examples of first layers used in this method include chromium (Cr), titanium-tungsten alloys (TiW), or any other metals which adhere well to the substrate at hand. This metal layer, which will function as part of the seed layer for electrodepositing solder balls, might be a ten-thousandth of a millimeter thick. On top of the first layer may be deposited a second layer, which may be an alloy of chromium-copper (CrCu) or nickel-vanadium (NiV). Finally, a third layer, usually of pure copper is deposited over the other layers. The thickness of the layers may vary, and is typically chosen to optimize the stress-thickness product, diffusion properties, and mechanical integrity.

The second preliminary step, after the seed layer is laid down, is to form a mask by photolithography. A layer of photoresist is laid onto the seed layer and exposed to light which cures the exposed photoresist. The unexposed photoresist remains uncured and can then be washed away to leave the cured photoresist behind as a mask, and, thus, the mask is complete. The complete mask has rows of holes where the solder bumps are to be deposited.

The third step is electrodeposition (electroplating) of lead or other solder alloy into the mask holes. An electrodeposited solder bump might be 0.25 millimeter high and contain a small amount of tin (Sn) and, thus, it will adhere well to the uppermost copper layer. Upon reflow, copper and tin react to form an "intermetallic" layer, $Cu_xSn_y$ (for example, $Cu_3Sn$), which creates a robust solder-to-BLM interface. It should be noted that plating processing is not subject to the same dimensional limitations as evaporation processing, and is extendible to very large wafers.

After the solder bumps are formed, the mask of cured photoresist is removed. The substrate is then covered with the continuous seed layer and numerous solder bumps.

After the seed layer is deposited over the substrate and the C4 bumps have been formed, the seed layer is removed from between the solder bumps to electrically isolate them. The removal can be accomplished by chemical etching, electroetching, or plasma etching. Removal of the seed layers leaves the solder bumps electrically isolated but mechanically fixed to the substrate. Regardless of the method used for seed layer removal, the solder bump protects the metal layers under it during processing. Thus, isolated BLM pads underneath the solder bumps are created. Finally, a solder ball can be formed by melting or reflowing, and it is then ready to join to a receiving substrate.

Alloys of titanium-tungsten (TiW; tungsten is also called "wolfram") have been used in the prior art as "barrier" layers to protect chip parts for a wide variety of applications. TiW is metallic and will conduct electricity. A thin film of TiW can be applied by conventional microelectronic techniques including sputtering. As discussed above, the use of TiW as a first layer in C4 fabrication by electroplating is one such employment. If TiW is used, it may be desirable to remove the TiW at some stage of fabrication. The problem of removing TiW has been addressed by several patents.

U.S. Pat. No. 5,130,275 teaches post- fabrication processing of semiconductor chips. Its method is intended for solder joining of chips to TAB packages, where the solder is flowed rather than crushed to make the connection. It employs a barrier metal layer, of 10% Ti and 90% W by weight, coated over aluminum (Al) or gold (Au) interconnect pads and a passivating layer of $SiO_2$. A Cu or Au seed layer is coated over the barrier layer. The thickness of metal over the pads is increased by electrodeposition of Cu or Au bumps into holes in a photoresist mask. Solder containing Sn is deposited on top of the Cu or Au. Subsequently, first the seed layer and then the barrier layer are etched away to leave the built-up pads ready for soldering.

The seed layer, if of gold, is removed by chemical etching in 10% potassium cyanide. This etchant attacks the bump as well, but this disclosure accepts the resulting bump damage and asserts that it is minimal, because the bump is 25 microns thick whereas the seed layer is only 0.3 microns thick.

Next, the TiW barrier is etched in an aqueous solution of 30% hydrogen peroxide. The disclosure notes (column 8, line 37) that peroxide can corrode the solder bead atop the Cu/Au bump. Prevention of corrosion is taught by adjusting the pH of the solution to between 9 and 11 (basic). The preferred solution is 7% oxidized ammonium persulfate and 1% to 2% hydrogen peroxide, with the pH adjusted to between 9 and 11 by adding ammonium hydroxide. Nevertheless, these etchants will attack aluminum.

U.S. Pat. No. 5,041,191 teaches a 10% Ti-90% W barrier layer. It uses the TiW layer to prevent undesirable intermetallics that form when Au, Cu, or Al contacts are deposited directly onto a thin-film resistor of nickel-chromium alloy. The TiW etchant is 5 grams of cupric sulfate ($CuSO_4$) 110 ml ammonium hydroxide ($NH_4OH$), 100 ml glycerol, and 125 ml deionized water.

This solution does not affect the nickel chromium, according to the disclosure. Nevertheless, like the etchant of the '275 patent, this solution is alkaline and will attack aluminum.

U.S. Pat. No. 4,671,852 teaches an etchant comprised of hydrogen peroxide, ethylenediaminetetraacetic acid (EDTA), and ammonium hydroxide for removing a thin (0.05–0.10 microns) film of 10%–30% by weight Ti and 90%–60% by weight W. The device to be etched is a chemically sensitive Silicon Gate Field Effect Transistor (SGFET) structure with an internal cavity. Etchant is introduced into the cavity, which also contains a noble metal (platinum) and an aluminum oxide or silicon oxide "fugitive" layer. The etchant is intended to selectively etch the TiW film.

This etchant is 0.1 molar EDTA, 30% hydrogen peroxide, and concentrated ammonium hydroxide mixed in a respective volume ratio of 10:3:2. The disclosure states that the pH should be less than 11 (not too basic). It also teaches the use of other complexing agents in addition to EDTA, such as carboxylates, bipyridines, and the like, but no formulas or other details about these agents are provided. The etchant of this invention, too, will attack aluminum.

U.S. Pat. No. 4,814,293 also teaches chemical etching of 10% Ti-90% W. It notes that hydrogen peroxide causes inhomogeneous etching. In particular, features are irregularly undercut or under-etched when TiW films are layered between other metals. The agitation commonly used is ineffective in reducing the uneven results, and this disclosure advocates stagnant liquid etchants. The peroxide solution is buffered to a pH value between 1 and 6 (acidic). The preferred buffering compounds are acetic acid and ammonium acetate. Citric acid and sodium hydroxide are also used and the etch rate is varied with the pH. The solution of the '293 patent will severely attack lead-tin (PbSn) alloys such as solder. Moreover, the disclosure does not address selective etching of TiW in the presence of PbSn.

U.S. Pat. No. 4,554,050 teaches the use of Ti etchants in fabricating waveguides. Its etchant is composed of EDTA, water, hydrogen peroxide, and ammonium hydroxide. One formula presented is 2.5 g of disodium EDTA in 100 ml of deionized water (a 0.067 M solution) with 10 g hydrogen peroxide and 4.2 g ammonium hydroxide, having a pH of about The etch rate is controlled by varying the OH-concentration and the temperature. The solution was tested at 20 degrees C. (room temperature) and at 60 degrees C. The '050 patent disclosure indicates that its solution will etch aluminum. Moreover, its solution will also attack PbSn.

U.S. Pat. No. 5,462,638 discloses a chemical etchant used to remove thin TiW films and a method of forming the etchant. The preferred alloy to be removed is 10% Ti and 90% W, which is deposited on a substrate. Chromium and copper seed layers are deposited on the TiW layer and C4 solder bumps are formed.

The disclosed etchant comprises between 1 and 2 parts of 30% by weight aqueous hydrogen peroxide, between 1 and 2 parts of an aqueous EDTA solution of between 15 and 40 g/l, and between 100 and 200 grams of salt per liter of the mixture. The salt is described as passivating the protected metal with a protective coating so that the protected metal is not attacked by the etchant.

Previous etchant compositions and methods used to remove TiW seed layers for C4 applications have encountered difficulties such as residual metal on the wafer and significant undercutting beneath the solder pad. FIGS. 2A and 2B show a wafer 2 having C4 solder bumps 4 with residual metal 12 and areas of excessive undercutting 20. In addition, under certain conditions, parts of the metal film to be removed can become etch-resistant, thus leaving un-etchable parts of the metal film. Longer etch times are ineffective at removing these residuals. These defects have caused silicon wafers to be inefficiently produced or inoperative. A need remains, therefore, for an improved process which overcomes the shortcomings of the conventional etching processes.

SUMMARY OF THE INVENTION

To meet this and other needs, and in view of its purposes, the present invention provides a solution and process for wet chemical etching of metal layers in the presence of metal to be protected in a pH range of about 2.7 to 4.0. In a preferred embodiment, the etchant solution and etching process are used with C4 solder bumps. It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1A:
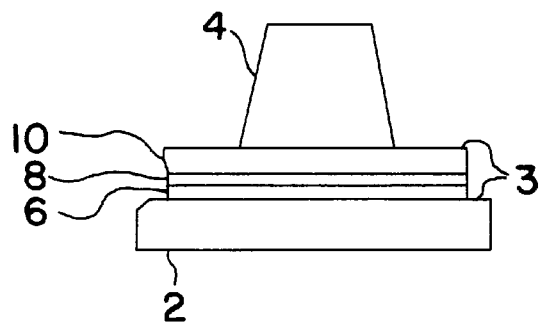
FIG. 1A is a side view of a wafer and C4 solder bump before etching the metal stack according to the present invention.
Figure 1B:
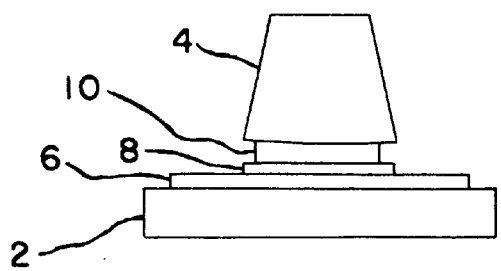
FIG. 1B is a side view of a wafer and C4 solder bump before etching the lower metal layer of the metal stack according to the present invention.
Figure 1C:
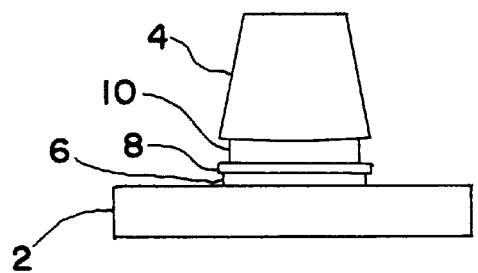
FIG. 1C is a side view of a wafer and C4 solder bump after etching the lower metal layer of the metal stack according to the present invention.

A typical C4 structure is shown in FIGS. 1A–1C in which a metal film is to be removed in the presence of a protected metal. This structure consists of a solder bump (or pad) 4 resting on a silicon device or wafer 2, interposed by a metal stack 3 known as the Ball Limiting Metallurgy (BLM). Solder bumps 4 can often be comprised of lead/tin alloys. A variety of metal combinations can be used for the metal stack 3 with one of the most common being Cr/Cu/Au. A preferred metal stack 3 for C4 bumps fabricated using electroplating is a tri-layer stack of TiW/CrCu/Cu. The use of a TiW layer as part of the metal stack 3 for C4's has several desirable features, including its adhesion properties, its barrier properties, stress characteristics, and compatibility with electroetching processes.

As indicated above, C4 solder bumps may be fabricated by evaporating solder through a metal (such as molybdenum) mask, electroplating, or other methods. During C4 fabrication by electroplating and as shown in FIGS. 1A–1C, a blanket stack of metal can be deposited on a functional silicon wafer 2. The metal stack 3 serves both as a conductive seed layer for the electrodeposition of solder through a photomask, and as the basis for the final BLM structure. The metal stack 3 preferably includes layers of TiW 6, CrCu 8, and Cu 10. After solder electrodeposition and photomask removal, the TiW/CrCu/Cu metal stack 3 between the pads must be removed to electrically isolate the interconnects and form the BLM. The top Cu 10 and CrCu 8 layers can be effectively electroetched, leaving a thin layer of TiW 6 behind. The final TiW layer 6 can be etched in a solution containing hydrogen peroxide, potassium sulfate, and potassium EDTA.

As indicated above, previous attempts to wet-etch a metal such as TiW in the presence of PbSn C4 solder bumps with peroxide, potassium sulfate, and potassium EDTA have encountered several difficulties. In order to manufacture reliable devices and to prevent inter-pad shorting, the TiW layer between C4's must be completely removed. In addition, the TiW layer cannot be undercut more than 4 $\mu$m beneath the solder pad. Excessive undercutting has been proven to cause premature fatigue failure of C4's and their respective devices.

Figure 2A:
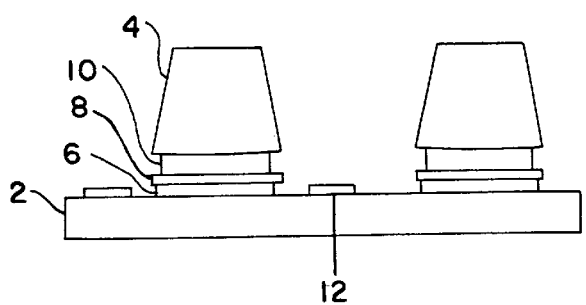
FIG. 2A is a side view of a wafer and C4 solder bumps displaying residual metal on the wafer.
Figure 2B:
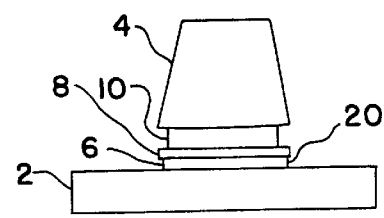
FIG. 2B is a side view of a wafer and C4 solder bump showing undercutting of the metal.

During conventional etching and as shown in FIGS. 2A and 2B, both residual metal 12 and excessive undercut defects 20 frequently occur. This may be partially remedied by pre-cleaning with acid to remove surface oxides. Nevertheless, etching wafers in both stagnant and recirculating environments has been unsuccessful in improving on these defects. Large variations in results from wafer-to-wafer frequently occur which prevents batch processing. In addition, a single wafer can often have both underetched and overetched regions.

Figure 3A:
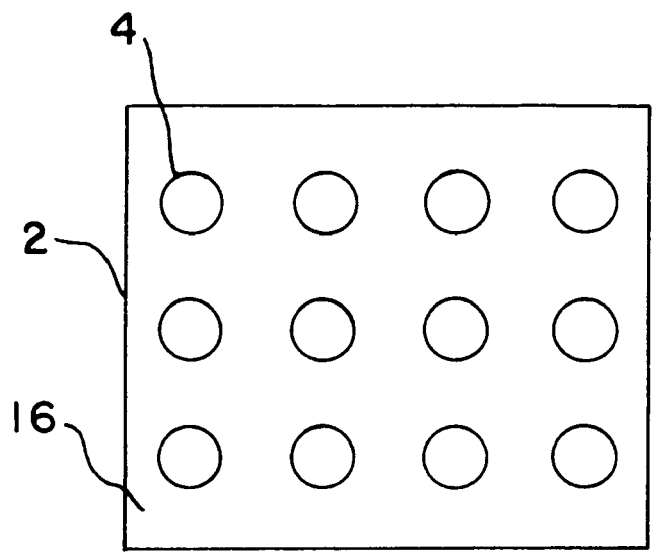
FIG. 3A is a top view of a wafer and C4 solder bumps showing isotropic etching according to the present invention.
Figure 3B:
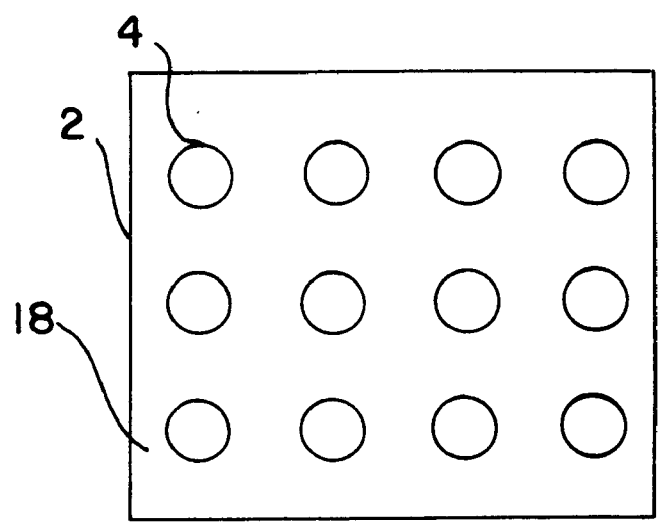
FIG. 3B is a top view of a wafer and C4 solder bumps showing grain boundary etching.

Conventional processes cannot deliver the desired manufacturing chip yields in excess of 99%. In addition, as discussed above, "etch-resistant TiW," a defect consisting of localized regions of unetchable metal, often occurs when using these processes. The present invention has identified the presence of "etch-resistant TiW," as shown in FIGS. 3A and 3B, as attributable to the adsorption of tungsten oxides on the surface of the metal. The adherence of these compounds to the TiW surface changes the etch mechanism from the desired isotropic process 16 (shown in FIG. 3A) to undesirable grain boundary attack 18 (shown in FIG. 3B).

The step of re-etching the wafer for additional time does not cure this defect, and it causes severe undercutting of TiW. The unetched metal is characteristically different than the residual metal 12, shown in FIG. 2A, which may occur from short etch times or insufficient mass transfer. Instead of the metal being thin and continuous, it is thick and discontinuous, with missing portions of hexagonal geometry. These defects were shown to appear and disappear while carrying out experiments over different pH ranges. Thus, within different pH ranges, the mechanism of TiW etching yields different results, even though measured etch rates may be approximately the same.

A solution that may be used to wet-etch TiW in the presence of plated C4 (PbSn) solder bumps contains hydrogen peroxide, potassium sulfate, and potassium EDTA. The hydrogen peroxide level primarily influences the overall etch rate, while the potassium sulfate level controls the extent of passivation of the PbSn surface during etching. The potassium EDTA is a chelating agent, which binds to metals, including copper and titanium, to prevent their re-deposition on the solder-bump surface, and the catalytic decomposition of the etch bath itself.

The preferred hydrogen peroxide content of the solution is in a range between 160 and 180 g/l in order to yield an etch rate that is slow enough for lead passivation to occur, but fast enough to remove the TiW without excessive conversion of lead to lead sulfate by free sulfate ions from the potassium sulfate. In addition, this concentration can be realistically maintained in a manufacturing environment. The potassium sulfate content of the solution is in the range between 150 and 210 g/l, in order to provide rapid passivation of the PbSn solder bumps. The solution contains EDTA levels with a buffering capacity between 0.08–0.12. The buffering capacity is defined as the gram equivalent weight of titrant required to raise the pH of 1 mL of etch bath from 4.0 to 5.0. The presence of EDTA prevents rapid, uncontrolled degradation of peroxide in the bath due to free metals. Further, this EDTA level can realistically be maintained in a manufacturing environment.

Within the ranges of solution components disclosed above, the pH of the etch bath can be adjusted (with sulfuric acid or other pH modifiers) to improve the etching mechanism and achieve the desired results. If the pH of the solution is below approximately 4.0, the TiW etches isotropically (shown in FIG. 3A), which results in uniform thinning and trouble-free removal of the entire metal film. In contrast, if the pH of the solution is above approximately 4.0, the etch solution passivates the surface of the TiW and attacks the grain boundaries of the metal film (shown in FIG. 3B). As a result, individual grains are carved out and released into solution. The non-isotropic nature of this mechanism leads to highly non-uniform removal of TiW, and often leaves behind unetchable regions.

A pH range for the solution of between 2.7 and 4.0 has demonstrated desirable results and, in this range, the TiW does not become unetchable. This pH range improves etching because Ti is reacted with hydrogen peroxide and EDTA to form a soluble titanium complex. W is reacted with hydrogen peroxide to form $H_2WO_4$ and water. Etching of W is accelerated at very high pH and this maintains W in the solution as $WO_4$ At very low pH, W may exist as tungstic acid, $H_2WO_4$, which is not as soluble. At intermediate pH, it may form polytungstates, which are known to exist in numerous forms. Other complexes, such as lead-tungstate ($PbWO_4$), are also byproducts of the etching process. Within certain pH ranges, these byproducts can form gels that cover the TiW surface and inhibit etching.

The formation of a titanium complex is also pH dependent. At very low pH, the EDTA would become protonated and lose its ability to chelate metals. In contrast, at high pH, the hydroxide may displace the EDTA or break down the peroxide bonds, thereby destroying the complex.

Thus, a pH range of about 2.7 to 4.0 for the etchant solution has achieved the desired efficiency in manufacturing of C4 devices and has eliminated most of the defects associated with etching TiW. A pH range of about 3.4 to 3.9 is particularly preferred to achieve these results.

The present invention is not in any way restricted to TiW etching in the presence of C4 pads, but can be widely applied to other metal/substrate/bath configurations. It is particularly applicable to those configurations that involve etching in the presence of corrodible features.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A solution for wet etching a metal film in the presence of a protected metal on a substrate comprising hydrogen peroxide, potassium sulfate, and potassium EDTA wherein the pH of the solution is between about 2.7 and 4.0.

2. The solution according to claim 1 wherein the substrate is a semiconductor and includes solder bumps.

3. The solution according to claim 1 wherein the substrate is a semiconductor and includes C4 solder bumps.

4. The solution according to claim 1 wherein (a) the solution comprises about 160–180 g/l of hydrogen peroxide and about 150–210 g/l of potassium sulfate, and (b) the potassium EDTA has a buffering capacity of 0.08–0.12.

5. The solution according to claim 1 wherein the pH of the solution is about 3.4 to 3.9.

6. A solution for wet etching a metal film in the presence of a protected metal on a semiconductor substrate including C4 solder bumps, comprising:

about 160–180 g/l of hydrogen peroxide;

about 150–210 g/l of potassium sulfate; and potassium EDTA having a buffering capacity of 0.08–0.12 wherein the pH of the solution is between about 3.4 and 3.9.

* * * * *